(12) United States Patent
Xie et al.

(10) Patent No.: US 12,457,793 B2
(45) Date of Patent: Oct. 28, 2025

(54) VERTICAL TRANSPORT FIELD EFFECT TRANSISTOR (VTFET) WITH BACKSIDE WRAPAROUND CONTACT

(71) Applicant: International Business Machines Corporation, Armonk, NY (US)

(72) Inventors: Ruilong Xie, Niskayuna, NY (US); Brent A. Anderson, Jericho, VT (US); Lawrence A. Clevenger, Saratoga Springs, NY (US); Nicholas Anthony Lanzillo, Wynantskill, NY (US); Reinaldo Vega, Mahopac, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 17/978,942

(22) Filed: Nov. 1, 2022

(65) Prior Publication Data
US 2024/0145311 A1 May 2, 2024

(51) Int. Cl.
*H10D 30/67* (2025.01)
*H01L 21/768* (2006.01)
*H01L 23/528* (2006.01)
*H01L 23/535* (2006.01)
*H10D 30/01* (2025.01)
*H10D 30/63* (2025.01)
*H10D 84/01* (2025.01)
(Continued)

(52) U.S. Cl.
CPC ........ *H10D 84/013* (2025.01); *H01L 23/5286* (2013.01); *H01L 23/535* (2013.01); *H10D 30/025* (2025.01); *H10D 30/63* (2025.01); *H10D 84/038* (2025.01)

(58) Field of Classification Search
CPC .. H10D 30/025; H10D 30/63; H10D 30/6728; H10D 84/016; H10D 84/0149; H10D 84/013; H01L 21/76897; H01L 23/5286; H01L 23/535
See application file for complete search history.

(56) References Cited

U.S. PATENT DOCUMENTS

| 9,356,043 B1 | 5/2016 | Sakakibara et al. |
| 9,595,535 B1 | 3/2017 | Ogawa et al. |
| 9,812,461 B2 | 11/2017 | Doda et al. |

(Continued)

FOREIGN PATENT DOCUMENTS

CN 104009088 B 4/2017

*Primary Examiner* — Sonya McCall-Shepard
(74) *Attorney, Agent, or Firm* — Samuel Waldbaum; Otterstedt & Kammer PLLC

(57) ABSTRACT

A vertical transport field effect transistor (VTFET) apparatus includes a fin-shaped channel structure; a gate stack that surrounds the channel structure; a top source/drain structure at a top end of the channel structure; a top interconnect layer above the top source/drain structure; a top contact that electrically connects the top source/drain structure to the top interconnect layer; a bottom source/drain structure at a bottom end of the channel structure; a backside interconnect layer below the bottom source/drain structure; and a backside contact that touches a bottom surface of the bottom source/drain structure and also touches a side surface of the bottom source/drain structure and electrically connects the bottom source/drain structure to the backside interconnect layer.

16 Claims, 9 Drawing Sheets

(51) Int. Cl.
    *H10D 84/03*     (2025.01)
    *H10D 84/83*     (2025.01)

(56) References Cited

U.S. PATENT DOCUMENTS

| | | |
|---|---|---|
| 10,079,230 B2 | 9/2018 | Stuber |
| 10,242,994 B2 | 3/2019 | Inomata et al. |
| 10,910,385 B2 | 2/2021 | Zhang |
| 10,950,722 B2 | 3/2021 | Zhang |
| 10,985,064 B2 | 4/2021 | Zhang |
| 11,145,550 B2 | 10/2021 | Wang |
| 11,251,295 B1 | 2/2022 | Shealy |
| 2017/0294377 A1 | 10/2017 | Dunga et al. |
| 2018/0190670 A1 | 7/2018 | Ryckaert et al. |
| 2018/0315850 A1 | 11/2018 | Liu et al. |
| 2021/0327766 A1 | 10/2021 | Wang et al. |
| 2023/0197815 A1* | 6/2023 | Huang .................. H10D 84/83 257/288 |

* cited by examiner

VERTICAL TRANSPORT FIELD EFFECT TRANSISTOR (VTFET) WITH BACKSIDE WRAPAROUND CONTACT

BACKGROUND

The present invention relates to the electrical, electronic, and computer arts, and more specifically, to vertical transport field effect transistors (VTFETs).

In VTFETs, generally, vertical semiconductor fins form channel structures that connect top source/drain structures to bottom source/drain structures. The source/drain structures generally are epitaxially grown semiconductors. Generally, VTFETs are implemented in complementary metal oxide semiconductor (CMOS) technology, i.e. pairs of n-type and p-type (NFET and PFET) transistors forming a logic gate. Sometimes, the VTFET logic gates include multiple pairs of transistors and are more complex than NOT gates, e.g., NAND or NOR gates. Metal contacts extend from the top and bottom source/drain structures to an interconnect layer above the top source/drain structures. Each source/drain structure has its own associated contact.

SUMMARY

Principles of the invention provide techniques for a VTFET with backside wraparound contact.

In one aspect, an exemplary vertical transport field effect transistor (VTFET) apparatus includes a fin-shaped channel structure; a gate stack that surrounds the channel structure; a top source/drain structure at a top end of the channel structure; a top interconnect layer above the top source/drain structure; a top contact that electrically connects the top source/drain structure to the top interconnect layer; a bottom source/drain structure at a bottom end of the channel structure; a backside interconnect layer below the bottom source/drain structure; and a backside contact that touches a bottom surface of the bottom source/drain structure and also touches a side surface of the bottom source/drain structure and electrically connects the bottom source/drain structure to the backside interconnect layer.

According to another aspect, an exemplary vertical transport field effect transistor (VTFET) apparatus includes a fin-shaped channel structure; a gate stack surrounding the channel structure; a top source/drain structure at a top end of the channel structure; a top interconnect layer above the top source/drain structure; a top contact that electrically connects the top source/drain structure to the top interconnect layer; a bottom source/drain structure at a bottom end of the channel structure; a backside interconnect layer below the bottom source/drain structure; a backside contact that touches a bottom surface of the bottom source/drain structure and also touches a side surface of the bottom source/drain structure and electrically connects the bottom source/drain structure to the backside interconnect layer; a fin-shaped second channel structure; a second gate stack surrounding the second channel structure; a second top source/drain structure at a top end of the second channel structure, which electrically connects the second top source/drain structure to the top interconnect layer; and a second bottom source/drain structure at a bottom end of the second channel structure. The backside contact touches a bottom surface of the second bottom source/drain structure and also touches a side surface of the second bottom source/drain structure and electrically connects the second bottom source/drain structure to the backside interconnect layer. The apparatus also includes a fin-shaped third channel structure; a third gate stack surrounding the third channel structure; a third top source/drain structure at a top end of the third channel structure; a third top contact that electrically connects the third top source/drain structure to the top interconnect layer; a third bottom source/drain structure at a bottom end of the third channel structure; a second backside contact that touches a bottom surface of the third bottom source/drain structure and also touches a side surface of the third bottom source/drain structure and electrically connects the third bottom source/drain structure to the backside interconnect layer; and shallow trench isolation that is interposed between the backside contact and the second backside contact and is interposed between the bottom source/drain structure and the third bottom source/drain structure.

According to another aspect, an exemplary method is provided for making a vertical transport field effect transistor (VTFET) with a backside contact. The method includes, forming a precursor structure, in which a sacrificial shallow trench isolation structure protrudes between two bottom source/drain structures; then, arranging the precursor structure with the sacrificial shallow trench isolation structure protruding upward; depositing an organic planarization layer over the so-arranged precursor structure; patterning the organic planarization layer to reveal portions of the sacrificial shallow trench isolation structure; and, forming a cavity between the bottom source/drain structures by etching the sacrificial shallow trench isolation structure.

In view of the foregoing, techniques of the present invention can provide substantial beneficial technical effects. For example, one or more embodiments provide one or more of:

A VTFET with backside contact, which helps cell scaling because it does not need to have a sideways extension of the bottom source/drain epitaxy in order to support frontside contact connection.

A VTFET with reduced resistance between its bottom source/drain and backside contact, which enhances its performance.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

In VTFET technology, providing contacts from bottom source/drain structures to a top, frontside, or back-end-of-line (the three terms are used interchangeably) interconnect layer drives lower-than-desirable circuit density as space is provided for the bottom source/drain extension and bottom source/drain contact vias. It might seemingly be helpful to use "backside" contacts that connect the bottom source/drain structures to a backside interconnect layer at the opposite surface of the circuit from the top interconnect layer (which can be formed, for example, during back-end-of line (BEOL) processes). However, in the process of forming backside contacts after a frontside interconnect layer already has been formed, it becomes difficult to thermally anneal the backside contacts as might be desirable in order to reduce contact resistance. Accordingly, adoption of backside contacts has been discouraged by the contact resistance problem.

One way to advantageously reduce contact resistance, according to exemplary embodiments, is to make the backside contact touch a larger area of the bottom source/drain structure than has been conventional in the prior art. Providing a "wraparound" backside contact, as in one or more embodiments of the invention, mitigates the contact resistance issue and enables use of backside contacts, which, in turn, advantageously enable greater circuit density.

Figure 1:
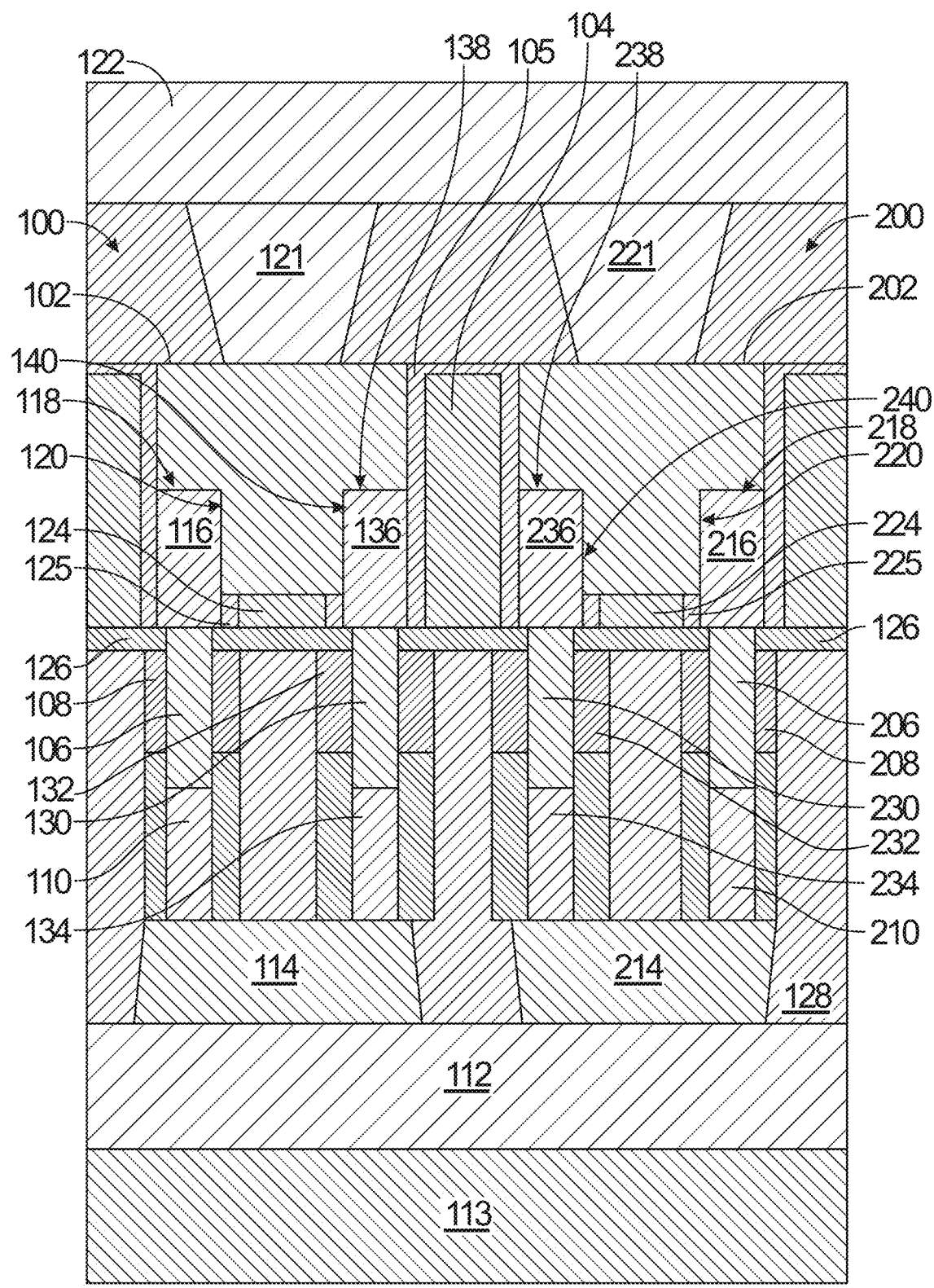
FIG. 1 through FIG. 3 depict, in schematics, a VTFET with wraparound backside contact, according to exemplary embodiments.
Figure 2:
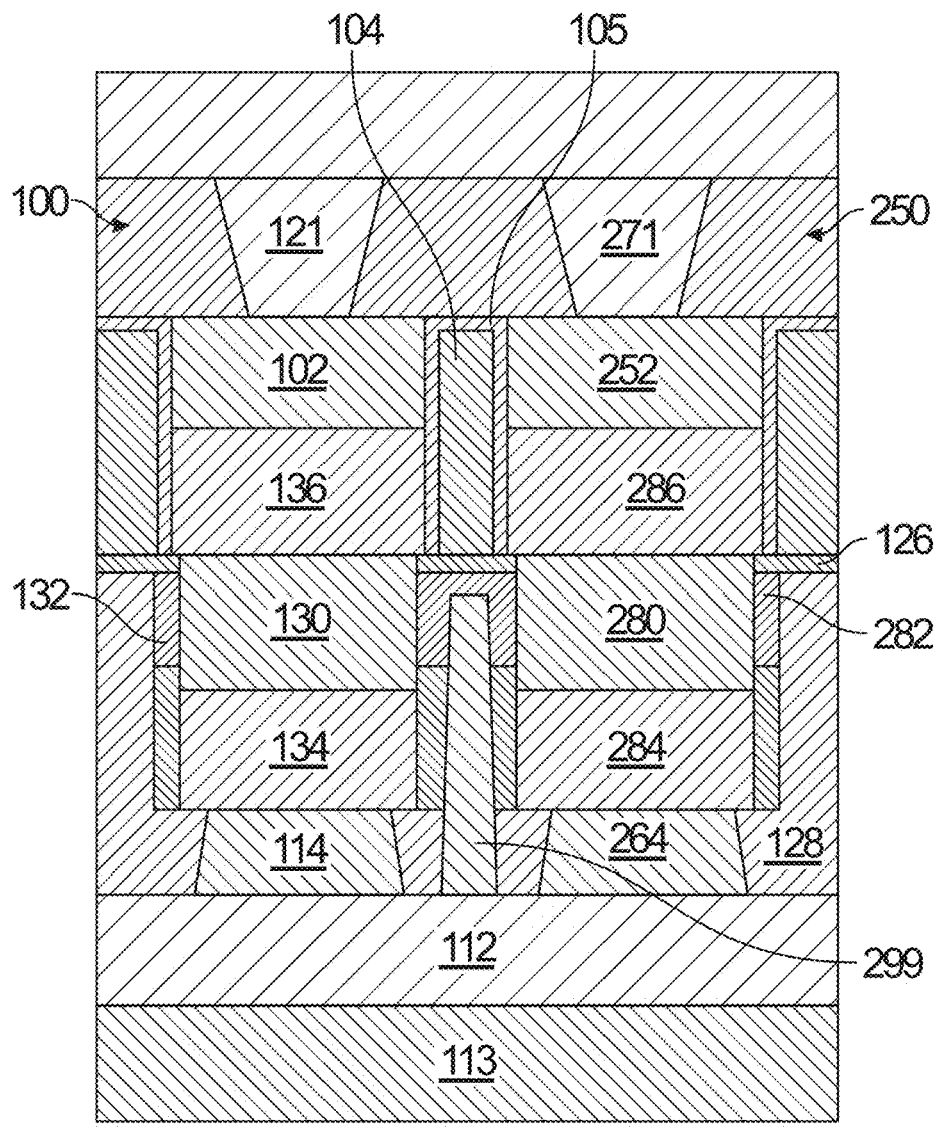
Figure 3:
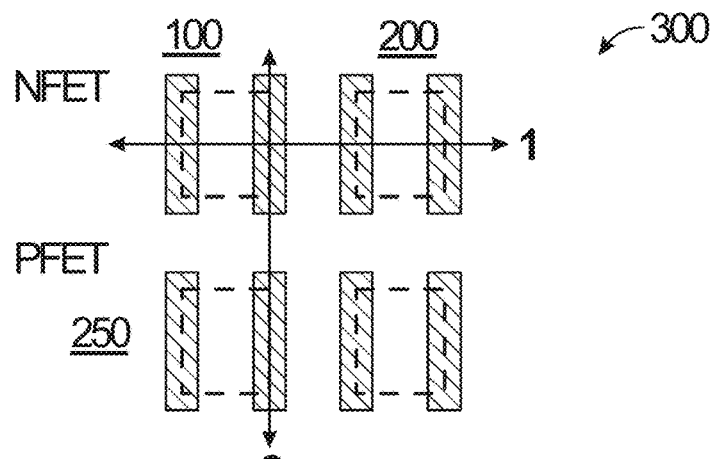

FIG. 1 through FIG. 3 depict, in schematics, a VTFET 100 that has a wraparound backside contact 102, according to exemplary embodiments. FIG. 1 and FIG. 2 are taken along lines 1 and 2 in FIG. 3, respectively. In one or more embodiments, the VTFET 100 is in an array 300 with at least two other VTFETs 200, 250 that have their own backside contacts 202, 252. VTFETs 100, 200 are n-doped (NFETs). VTFET 250 is p-doped (PFET). Shallow trench isolation 104 and a liner 105 separate the VTFETs 100, 200, 250.

Referring specifically to the VTFET 100, similar components of the VTFETs 200, 250 are not described in duplicate. The VTFET 100 includes a fin-shaped channel structure 106, 130 with a gate stack 108, 132 that surrounds the channel structure. The VTFET 200 has similar structures (Fins 206, 230, and gates 208, 232). At a top end of the channel structure 106, there is a top source/drain structure 110, and above the top source/drain structure there is a top interconnect layer 112. A carrier wafer 113 is attached to the top interconnect layer 112. The VTFET 200 has a similar structure 210 (FET 250 can also include a similar structure, label omitted to avoid clutter); interconnect layer 112 connects all the VTFETs and carrier wafer 113 supports the whole apparatus. A top contact 114 electrically connects the top source/drain structure 110 to the top interconnect layer 112. The VTFETs 200, 250 have similar structures 214, 264. At a bottom end of the channel structure 106, there is a bottom source/drain structure 116. The bottom source/drain structure 116 has a bottom surface 118 and a side surface 120 (see similar surface 220 in FET 200). The VTFET 200 has similar structures 216, 218. The backside contact 102 touches the bottom surface 118 of the bottom source/drain structure and also touches the side surface 120 of the bottom source/drain structure, and electrically connects the bottom source/drain structure, though a backside via 121, to a backside interconnect layer 122 that is below the bottom source/drain structure 116. The VTFET 200 has similar structures 202, 221. The backside interconnect layer 122 connects all the VTFETs.

In one or more embodiments, residual portions of a sacrificial shallow trench isolation (dielectric material 124, see similar 225 in FET 200) and dielectric liner 125 (see similar 225 in FET 200) separate the backside contact 102 from a bottom spacer 126.

An interlayer dielectric 128 separates the channel structure 106 and source/drain structures 110, 116 from adjacent second channel structure 130, second gate 132, second top source/drain structure 134, and second bottom source/drain structure 136. The VTFETs 200, 250 have similar structures 230, 280, 232, 282, 234, 284, 236, 286. The backside contact 102 touches bottom surface 138 (VTFET 200: bottom surface 238; VTFET 250 can also have a similar surface, label omitted to avoid clutter) and side surface 140 (see similar surface 240 in FET 200) of the second bottom source/drain structure 136, and electrically connects the second bottom source/drain structure 136 to the backside interconnect layer 122. The top contact 114 (VTFET 200: top contact 214; VTFET 250: top contact 264) electrically connects the second top source/drain structure 134 to the frontside interconnect layer 112. A gate contact 299 connects the gate stacks 132, 282 to the top interconnect layer 112.

Advantageously, the wraparound shape of the backside contact 102 increases its contact surface area with the bottom source/drain structures and thereby reduces contact resistance.

Figure 4:
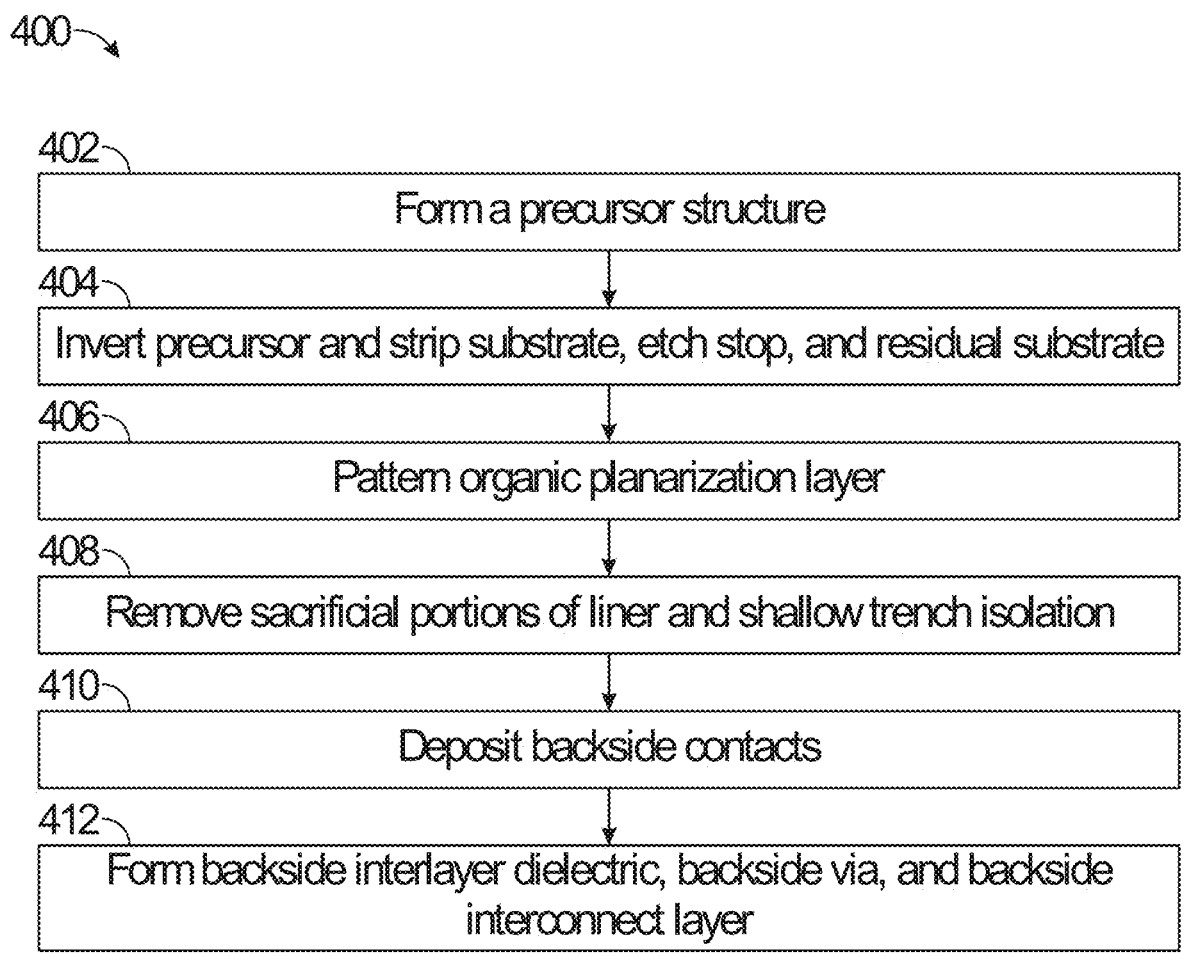
FIG. 4 depicts, in a flowchart, steps of a process for making the VTFET that is shown in FIG. 1 and FIG. 2.

Referring to FIG. 4, aspects of the invention provide a process 400 for making the VTFETs 100, 200, 250 that are shown in FIG. 1 and FIG. 2. FIG. 4 depicts steps of the process 400 in a flowchart. FIG. 5 through FIG. 14 depict structures that correspond to various steps of the process 400. Odd numbered FIGURES are taken along line 1 of FIG. 3. Even numbered FIGURES are taken along line 2 of FIG. 3.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

Figure 6:
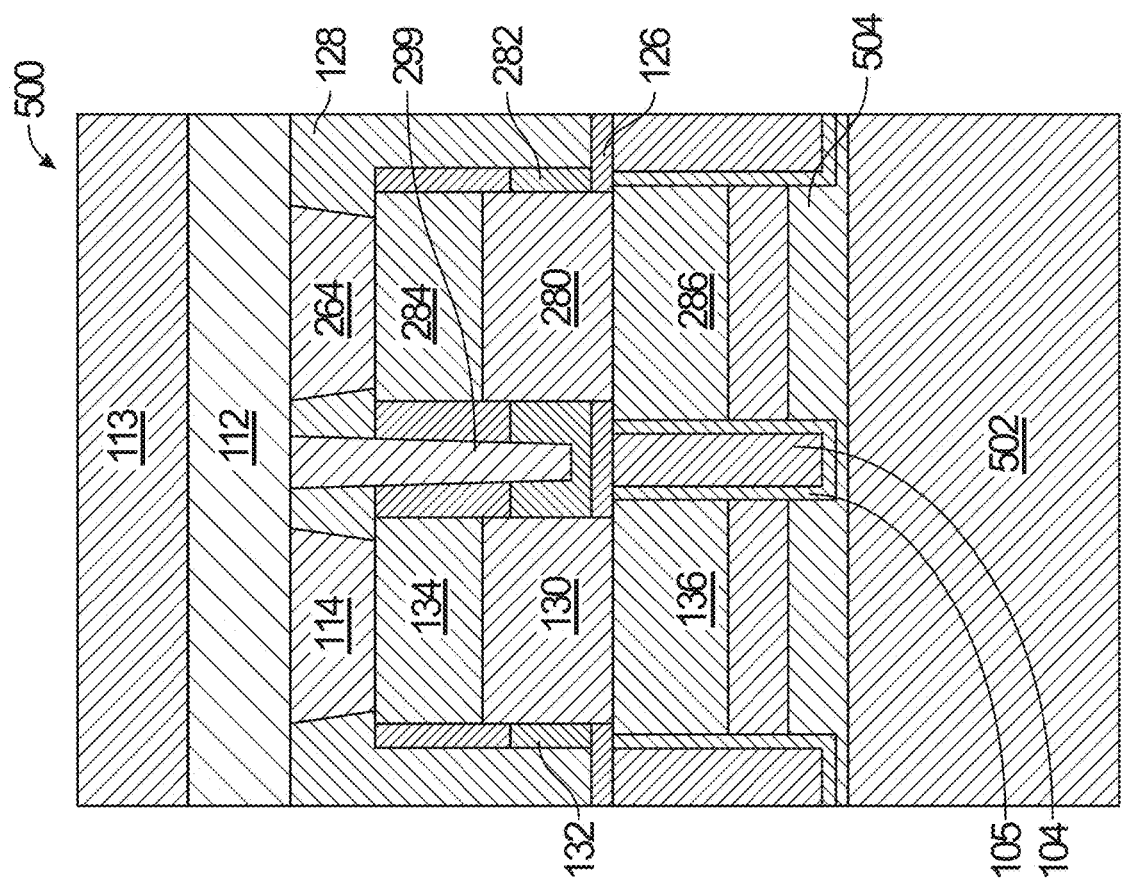
FIG. 5 through FIG. 14 depict, in schematics, intermediate structures that are formed according to steps of the process that is shown in FIG. 2.
Figure 5:
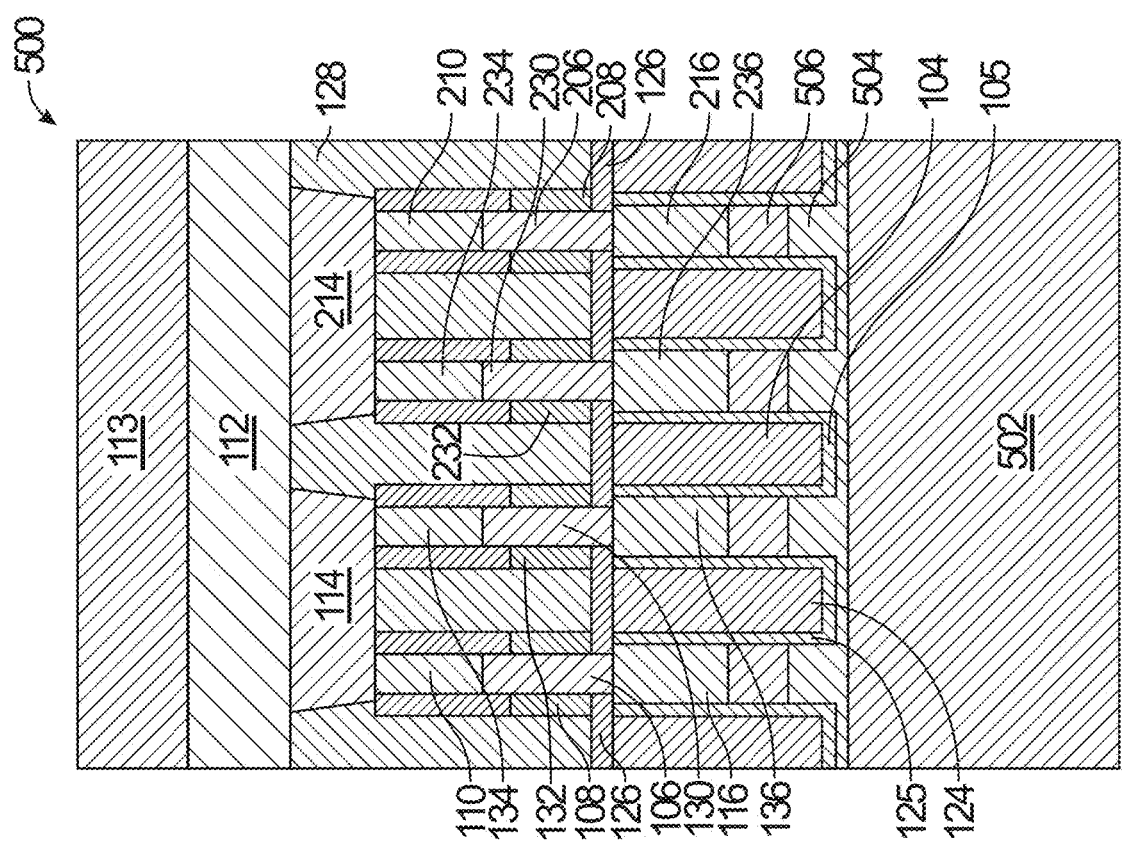

At 402, form a precursor structure 500, as shown in FIG. 5 and FIG. 6. The precursor structure includes bottom source/drain structures 116, 136, 216, 236, 286, channel structures 106, 130, 206, 230, 280, gate stacks 108, 132, 208, 232, 282, top source/drain structures 110, 134, 210, 234, 284, top contacts 114, 214, 264, and gate contact 299. The structure 500 also includes a substrate 502, an etch stop layer 504, and a residual substrate 506.

Various structures that are described herein, e.g., source/drain structures, may be epitaxially grown. "Epitaxy" or "epitaxial growth," as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, which forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

Figure 8:
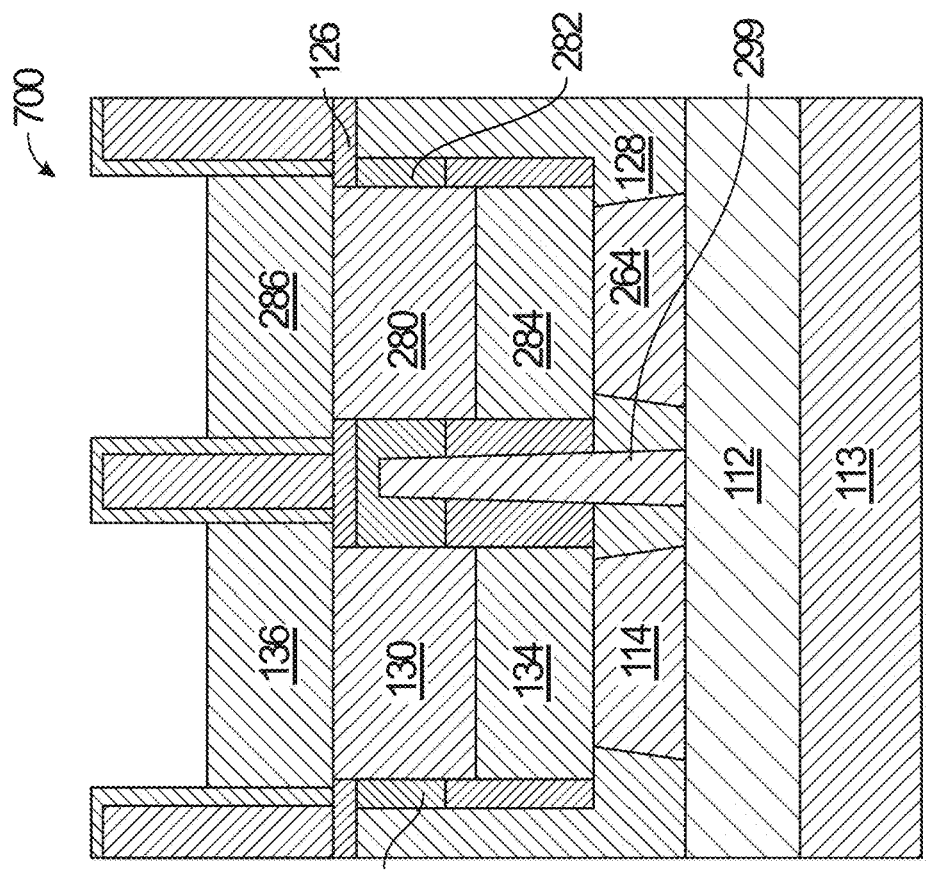
Figure 7:
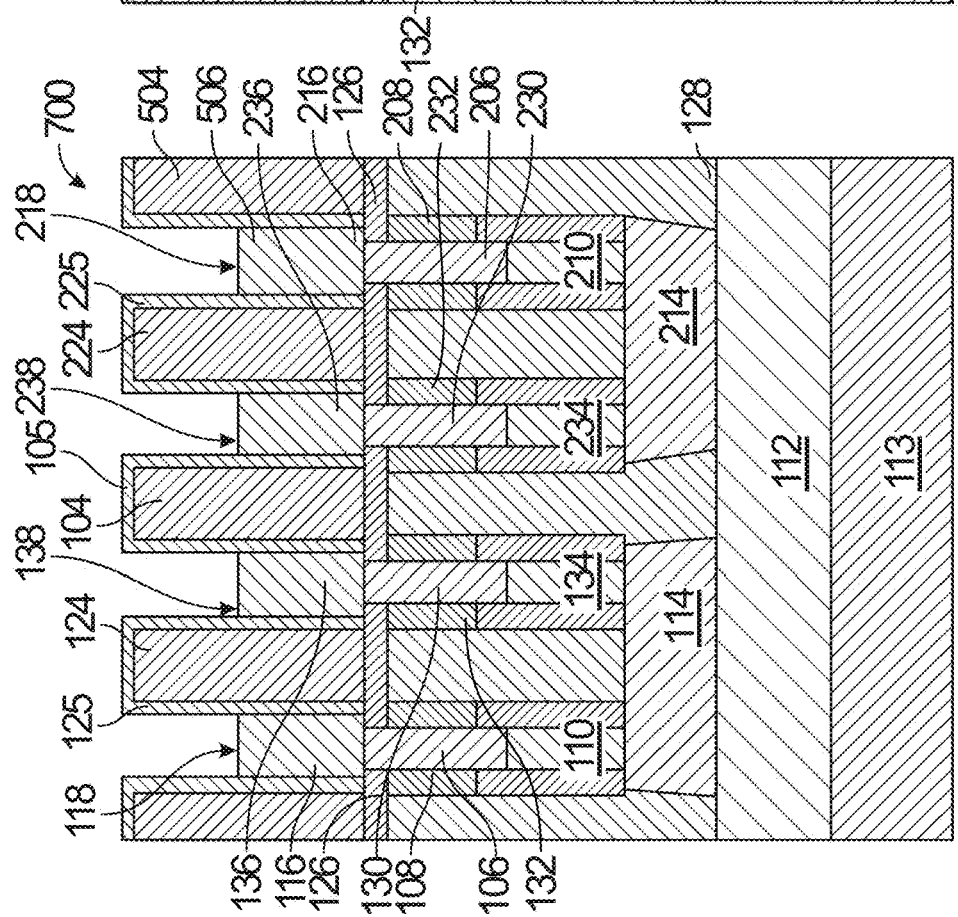

At 404, after wafer flipping the precursor structure 500, form an intermediate structure 700 by stripping the substrate 502, the etch stop layer 504, and the residual substrate 506, as shown in FIG. 7 and FIG. 8. In the structure 700, the shallow trench isolation 104 and the dielectric liner 105 protrude around the bottom source/drain structures 116, 136, 216, 236, 286.

Figure 10:
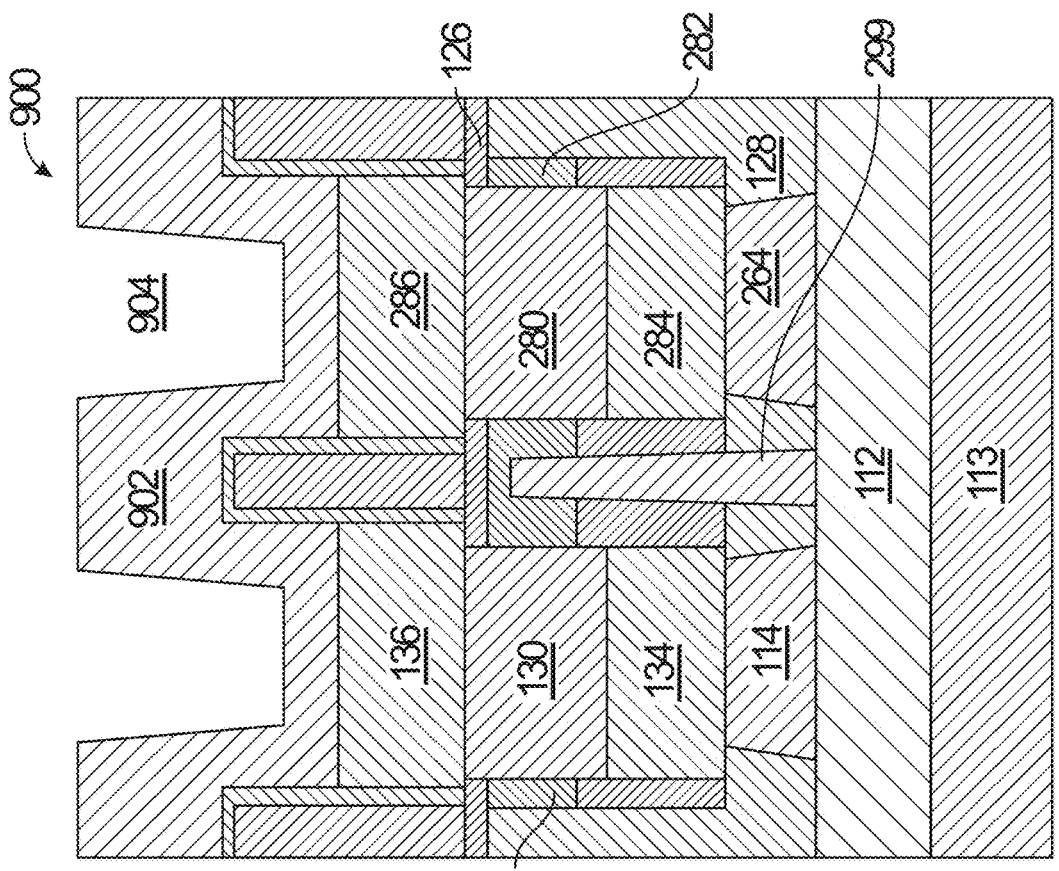
Figure 9:
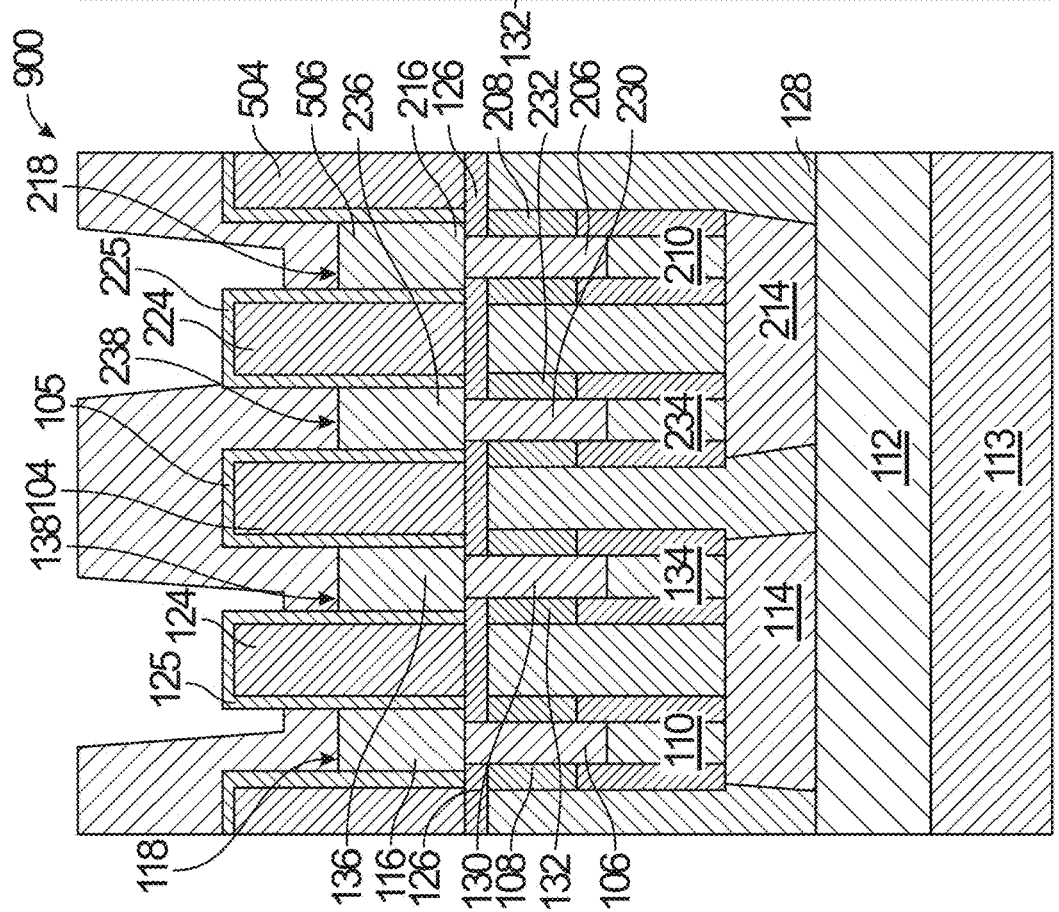

At 406, form an intermediate structure 900 by patterning an organic planarization layer (OPL) 902 as shown in FIG. 9 and FIG. 10. Although trenches 904 of the OPL 902 may not be perfectly aligned to the underlying structures, the shallow trench isolation 104 and the liner 105 include sacrificial portions 124, 125 that will self-align future process steps.

Figure 11:
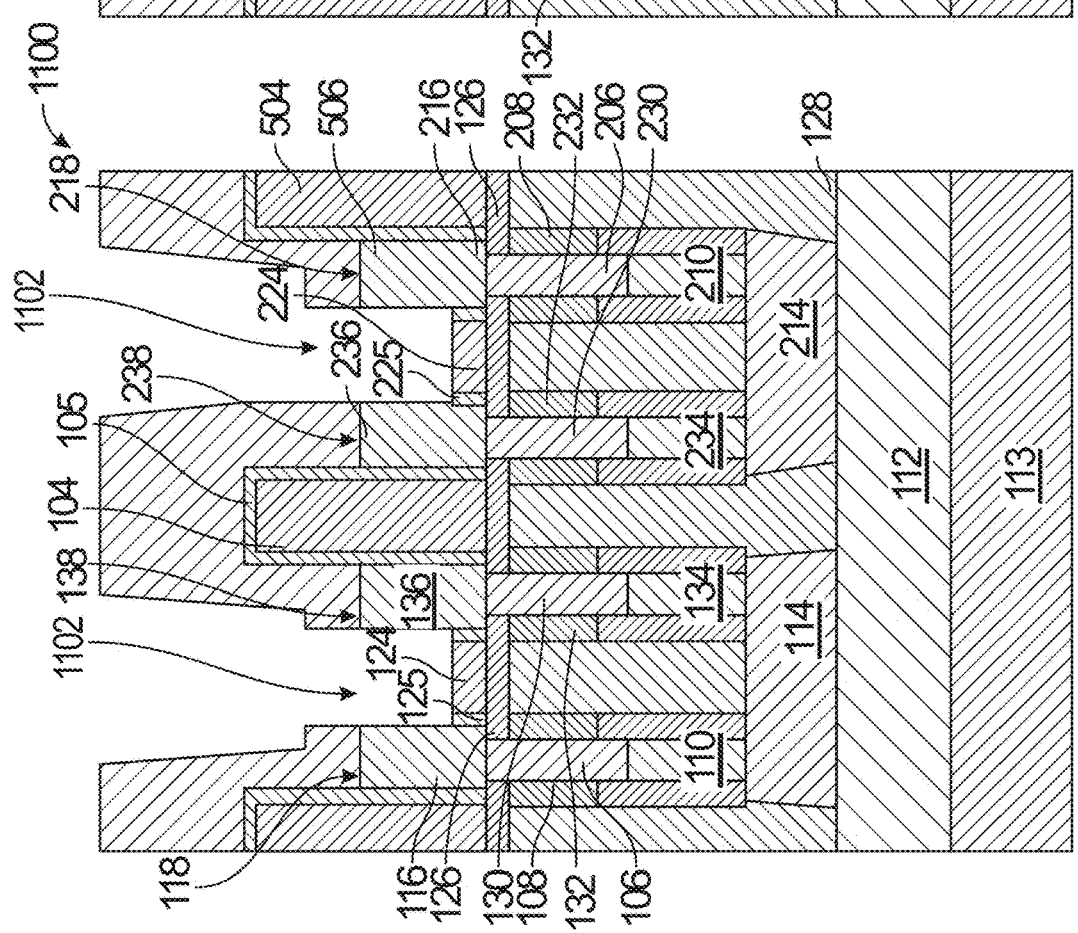
Figure 12:
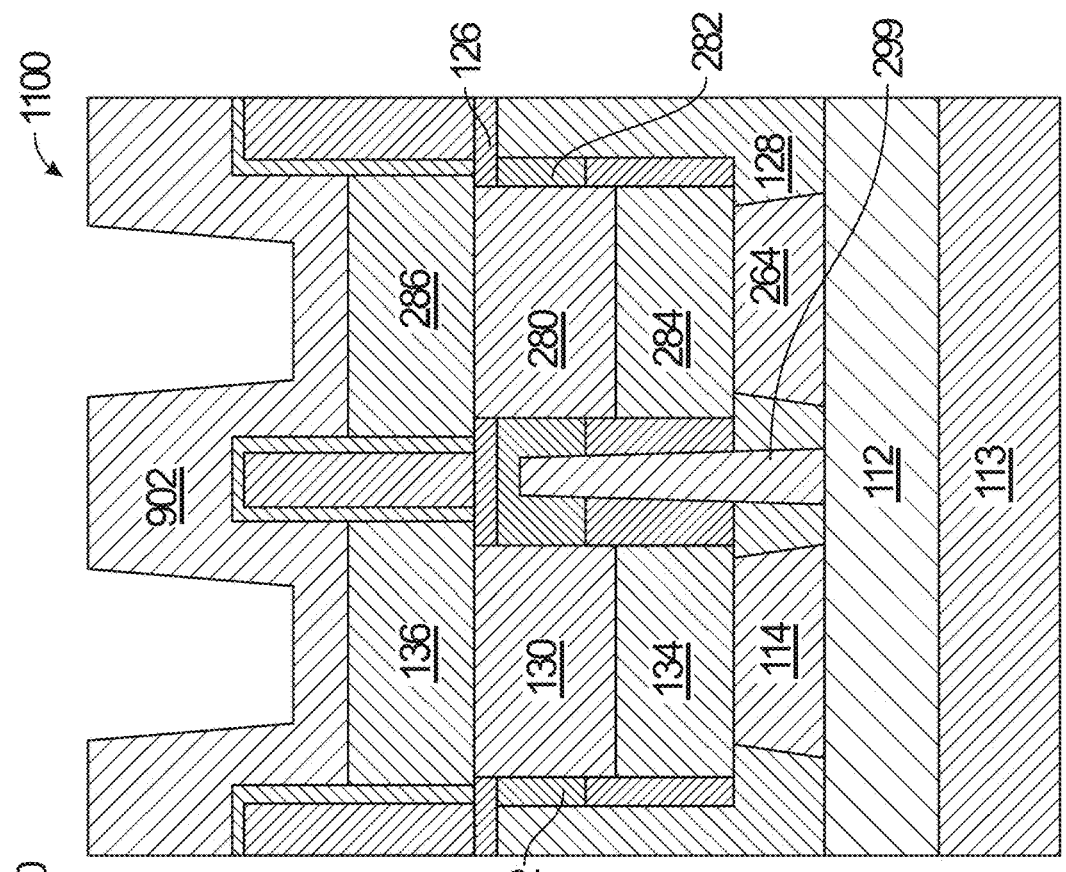

At 408, form an intermediate structure 1100, which is shown in FIG. 11 and FIG. 12, by removing most of the portions 124, 125 in multiple steps that are not individually shown because, given the teachings herein, the ordinary skilled worker will apprehend how to perform them using known techniques of semiconductor fabrication. For example, a selective etch process can be first used to remove exposed dielectric liner 125, followed by recessing STI dielectric fill material 124, followed by removing exposed dielectric liner 125 again. Removal of the sacrificial portions 124, 125 produces cavities 1102 between the bottom source/drain structures.

Those skilled in the art use numerous techniques to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Figure 14:
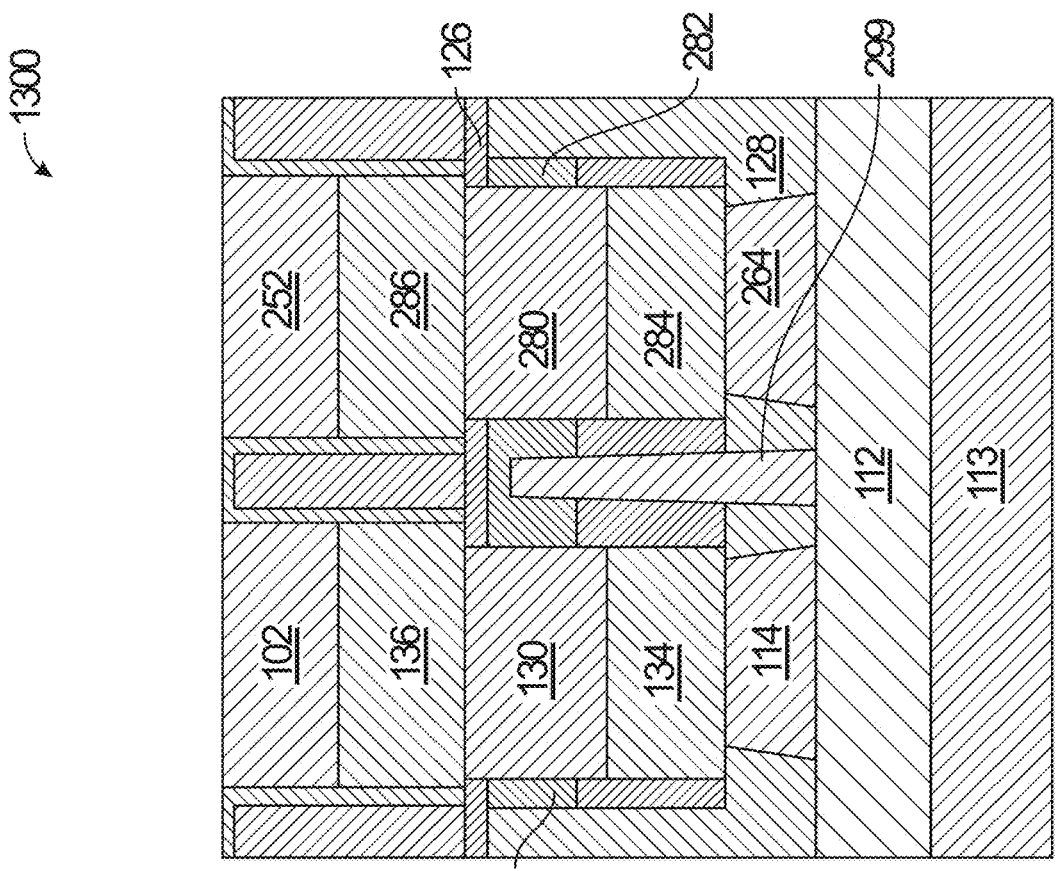
Figure 13:
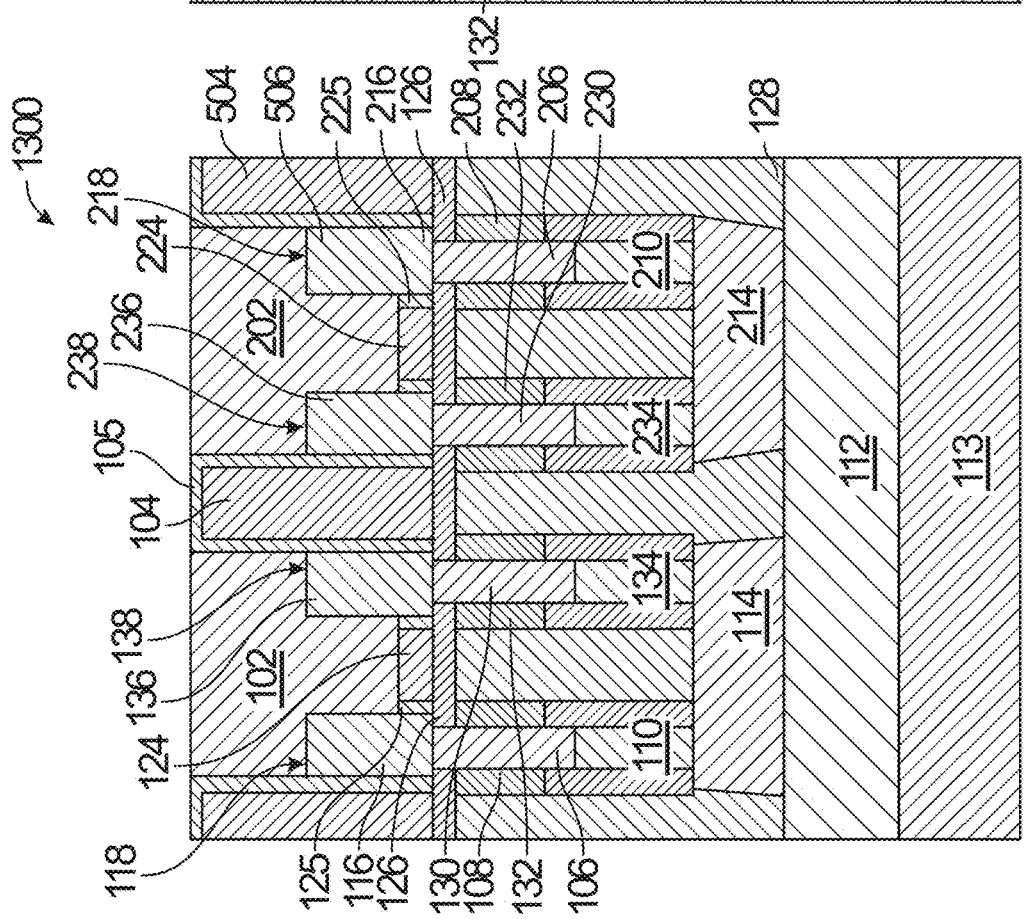
Figure 15:
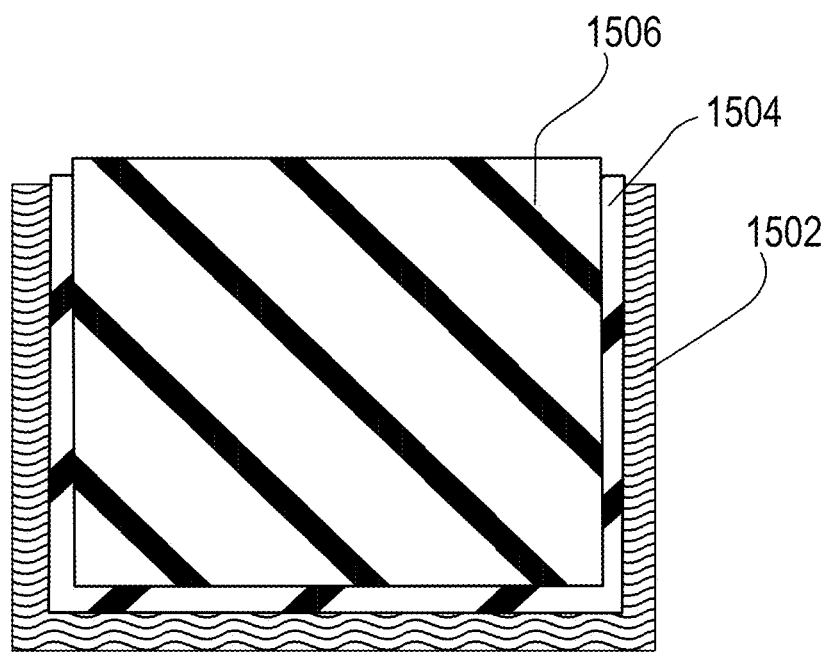
FIG. 15 depicts, in a schematic, layers of a backside contact according to exemplary embodiments.

At 410, deposit metal for the backside contacts 102, 202, 252 to form an intermediate structure 1300, as shown in FIG. 13 and FIG. 14. Referring to FIG. 15, each of the backside contacts 102, 202, 252 includes a silicide liner 1502 (e.g., TiSi, NiSi, NiPtSi), an adhesion metal liner 1504 (e.g., TiN or TaN), and a low resistance metal fill 1506, such as W, Co, Ru, or the like.

At 412, complete the VTFETs 100, 200, 250 by forming the backside vias 121, 221, 271 and backside interconnect layer 122 as shown in FIG. 1 and FIG. 2.

Given the discussion thus far, it will be appreciated that, in general terms, an exemplary vertical transport field effect transistor (VTFET) apparatus 100 includes a fin-shaped channel structure 106; a gate stack 108 that surrounds the channel structure; a top source/drain structure 110 at a top end of the channel structure; a top interconnect layer 112 above the top source/drain structure; a top contact 114 that electrically connects the top source/drain structure to the top interconnect layer; a bottom source/drain structure 116 at a bottom end of the channel structure; a backside interconnect layer 122 below the bottom source/drain structure; and a backside contact 102 that touches a bottom surface 118 of the bottom source/drain structure and also touches a side surface 120 of the bottom source/drain structure and electrically connects the bottom source/drain structure to the backside interconnect layer.

In one or more embodiments, the apparatus 100 also includes a fin-shaped second channel structure 130; a second gate stack 132 surrounding the second channel structure; a second top source/drain structure 134 at a top end of the second channel structure; and a second bottom source/drain structure 136 at a bottom end of the second channel structure. The second bottom source/drain structure has a bottom surface 138 and has a side surface 140 that faces the side surface 120 of the bottom source/drain structure. The top contact 114 electrically connects the second top source/drain structure to the top interconnect layer 122, and the backside contact 102 touches the bottom surface 138 of the second bottom source/drain structure and also touches the side surface 140 of the second bottom source/drain structure and electrically connects the second bottom source/drain structure to the backside interconnect layer.

In one or more embodiments, the side surfaces 120, 140 of the bottom source/drain structure and of the second bottom source/drain structure define a cavity into which the backside contact extends to a top end of the backside contact, wherein the cavity contains dielectric material 124 that touches the top end of the backside contact.

In one or more embodiments, there also is a liner 125 disposed between the dielectric material and the side surfaces of the bottom source/drain structure and of the second bottom source/drain structure.

In one or more embodiments, the top interconnect layer 112 has a top side and a carrier wafer 113 is attached at the top side of the top interconnect layer.

In one or more embodiments, the apparatus 300 also includes a fin-shaped second channel structure 280; a second gate stack 282 surrounding the second channel structure; a second top source/drain structure 284 at a top end of the second channel structure; a second top contact 264 that electrically connects the second top source/drain structure to the top interconnect layer; a second bottom source/drain structure 286 at a bottom end of the second channel structure; and a second backside contact 252 that touches a bottom surface of the second bottom source/drain structure and also touches a side surface of the second bottom source/drain structure and electrically connects the second bottom source/drain structure to the backside interconnect layer. Shallow trench isolation 104 is interposed between the backside contact and the second backside contact and is interposed between the bottom source/drain structure and the second bottom source/drain structure.

In one or more embodiments, the backside contact comprises a silicide liner 1502. In one or more embodiments, the backside contact comprises an adhesion metal liner 1504. In one or more embodiments, the backside contact is filled with a metal 1506 that is selected from the list consisting of: tungsten, cobalt, ruthenium.

According to another aspect, an exemplary vertical transport field effect transistor (VTFET) apparatus 300 includes a fin-shaped channel structure 106; a gate stack 108 surrounding the channel structure; a top source/drain structure 110 at a top end of the channel structure; a top interconnect layer 112 above the top source/drain structure; a top contact 114 that electrically connects the top source/drain structure to the top interconnect layer; a bottom source/drain structure 116 at a bottom end of the channel structure; a backside interconnect layer 122 below the bottom source/drain structure; a backside contact 102 that touches a bottom surface 118 of the bottom source/drain structure and also touches a side surface 120 of the bottom source/drain structure and electrically connects the bottom source/drain structure to the backside interconnect layer; a fin-shaped second channel structure 130; a second gate stack 132 surrounding the second channel structure; a second top source/drain structure 134 at a top end of the second channel structure, which electrically connects the second top source/drain structure to the top interconnect layer; and a second bottom source/drain structure 136 at a bottom end of the second channel structure. The backside contact touches a bottom surface 138 of the second bottom source/drain structure and also touches a side surface 140 of the second bottom source/drain structure and electrically connects the second bottom source/drain structure to the backside interconnect layer. The apparatus 300 also includes a fin-shaped third channel structure 280; a third gate stack 282 surrounding the third channel structure; a third top source/drain structure 284 at a top end of the third channel structure; a third top contact 264 that electrically connects the third top source/drain structure to the top interconnect layer; a third bottom source/drain structure 286 at a bottom end of the third channel structure; a second backside contact 252 that touches a bottom surface 288 of the third bottom source/drain structure and also touches a side surface of the third bottom source/drain structure and electrically connects the third bottom source/drain structure to the backside interconnect layer; and shallow trench isolation 104 that is interposed between the backside contact and the second backside contact and is interposed between the bottom source/drain structure and the third bottom source/drain structure.

In one or more embodiments, the side surfaces 120, 140 of the bottom source/drain structure and of the second bottom source/drain structure define a cavity 1102 into which the backside contact extends to a top end of the backside contact, wherein the cavity contains dielectric material 124 that touches the top end of the backside contact.

In one or more embodiments, a liner 125 is disposed between the dielectric material and the side surfaces of the bottom source/drain structure and of the second bottom source/drain structure.

In one or more embodiments, the top interconnect layer 112 has a top side, and a carrier wafer 113 is attached at the top side of the top interconnect layer.

In one or more embodiments, each of the backside contacts includes a silicide liner 1502. In one or more embodiments, each of the backside contacts includes an adhesion metal liner 1504. In one or more embodiments, each of the backside contacts is filled with a metal 1506 that is selected from the list consisting of: tungsten, cobalt, ruthenium.

According to another aspect, an exemplary method 400 is provided for making a vertical transport field effect transistor (VTFET) with a backside contact. The method 400 includes, at 402, forming a precursor structure, in which a sacrificial shallow trench isolation structure protrudes between two bottom source/drain structures; then, at 404, arranging the precursor structure with the sacrificial shallow trench isolation structure protruding upward; at 406, depositing an organic planarization layer over the so-arranged precursor structure and patterning the organic planarization layer to reveal portions of the sacrificial shallow trench isolation structure; and, at 408, forming a cavity between the bottom source/drain structures by etching the sacrificial shallow trench isolation structure.

In one or more embodiments, the method 400 also includes, at 410, forming a backside contact in the cavity. In one or more embodiments, forming the backside contact includes depositing a silicide liner and an adhesion metal liner. In one or more embodiments, forming the backside contact includes filling with a metal selected from the list consisting of: tungsten, cobalt, ruthenium.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical transport field effect transistor (VTFET) apparatus comprising:
   a fin-shaped channel structure;
   a gate stack surrounding the channel structure;
   a top source/drain structure at a top end of the channel structure;
   a top interconnect layer above the top source/drain structure;
   a top contact that electrically connects the top source/drain structure to the top interconnect layer;
   a bottom source/drain structure at a bottom end of the channel structure, wherein the bottom source/drain structure has a bottom surface and a side surface;
   a backside interconnect layer below the bottom source/drain structure; and
   a backside contact that touches the bottom surface of the bottom source/drain structure and also touches the side surface of the bottom source/drain structure and electrically connects the bottom source/drain structure to the backside interconnect layer.

2. The apparatus of claim 1, further comprising:
   a fin-shaped second channel structure;
   a second gate stack surrounding the second channel structure;
   a second top source/drain structure at a top end of the second channel structure; and
   a second bottom source/drain structure at a bottom end of the second channel structure, wherein the second bottom source/drain structure has a bottom surface and has a side surface that faces the side surface of the bottom source/drain structure,
   wherein the top contact electrically connects the second top source/drain structure to the top interconnect layer,
   wherein the backside contact touches the bottom surface of the second bottom source/drain structure and also touches the side surface of the second bottom source/drain structure and electrically connects the second bottom source/drain structure to the backside interconnect layer.

3. The apparatus of claim 2, wherein the side surfaces of the bottom source/drain structure and of the second bottom source/drain structure define a cavity into which the backside contact extends to a top end of the backside contact, wherein the cavity contains dielectric material that touches the top end of the backside contact.

4. The apparatus of claim 3, further comprising a liner disposed between the dielectric material and the side surfaces of the bottom source/drain structure and of the second bottom source/drain structure.

5. The apparatus of claim 2, wherein the top interconnect layer has a top side, further comprising:
   a carrier wafer that is attached at the top side of the top interconnect layer.

6. The apparatus of claim 1, further comprising:
   a fin-shaped second channel structure;
   a second gate stack surrounding the second channel structure;
   a second top source/drain structure at a top end of the second channel structure;
   a second top contact that electrically connects the second top source/drain structure to the top interconnect layer;
   a second bottom source/drain structure at a bottom end of the second channel structure, wherein the second bottom source/drain structure has a bottom surface and a side surface;
   a second backside contact that touches the bottom surface of the second bottom source/drain structure and also touches the side surface of the second bottom source/drain structure and electrically connects the second bottom source/drain structure to the backside interconnect layer; and
   shallow trench isolation that is interposed between the backside contact and the second backside contact and is interposed between the bottom source/drain structure and the second bottom source/drain structure.

7. The apparatus of claim 1, wherein the backside contact comprises a silicide liner.

8. The apparatus of claim 1, wherein the backside contact comprises an adhesion metal liner.

9. The apparatus of claim 1, wherein the backside contact is filled with a metal selected from the list consisting of: tungsten, cobalt, ruthenium.

10. A vertical transport field effect transistor (VTFET) apparatus comprising:
    a fin-shaped channel structure;
    a gate stack surrounding the channel structure;
    a top source/drain structure at a top end of the channel structure;

a top interconnect layer above the top source/drain structure;

a top contact that electrically connects the top source/drain structure to the top interconnect layer;

a bottom source/drain structure at a bottom end of the channel structure, wherein the bottom source/drain structure has a bottom surface and a side surface;

a backside interconnect layer below the bottom source/drain structure;

a backside contact that touches the bottom surface of the bottom source/drain structure and also touches the side surface of the bottom source/drain structure and electrically connects the bottom source/drain structure to the backside interconnect layer;

a fin-shaped second channel structure;

a second gate stack surrounding the second channel structure;

a second top source/drain structure at a top end of the second channel structure, wherein the top contact electrically connects the second top source/drain structure to the top interconnect layer;

a second bottom source/drain structure at a bottom end of the second channel structure, wherein the second bottom source/drain structure has a bottom surface and has a side surface that faces the side surface of the bottom source/drain structure, wherein the backside contact touches the bottom surface of the second bottom source/drain structure and also touches the side surface of the second bottom source/drain structure and electrically connects the second bottom source/drain structure to the backside interconnect layer;

a fin-shaped third channel structure;

a third gate stack surrounding the third channel structure;

a third top source/drain structure at a top end of the third channel structure;

a third top contact that electrically connects the third top source/drain structure to the top interconnect layer;

a third bottom source/drain structure at a bottom end of the third channel structure, wherein the third bottom source/drain structure has a bottom surface and a side surface;

a second backside contact that touches the bottom surface of the third bottom source/drain structure and also touches the side surface of the third bottom source/drain structure and electrically connects the third bottom source/drain structure to the backside interconnect layer; and shallow trench isolation that is interposed between the backside contact and the second backside contact and is interposed between the bottom source/drain structure and the third bottom source/drain structure.

11. The apparatus of claim 10, wherein the side surfaces of the bottom source/drain structure and of the second bottom source/drain structure define a cavity into which the backside contact extends to a top end of the backside contact, wherein the cavity contains dielectric material that touches the top end of the backside contact.

12. The apparatus of claim 11, further comprising a liner disposed between the dielectric material and the side surfaces of the bottom source/drain structure and of the second bottom source/drain structure.

13. The apparatus of claim 12, wherein the top interconnect layer has a top side, further comprising:

a carrier wafer that is attached at the top side of the top interconnect layer.

14. The apparatus of claim 10, wherein each of the backside contacts comprises a silicide liner.

15. The apparatus of claim 10, wherein each of the backside contacts comprises an adhesion metal liner.

16. The apparatus of claim 10, wherein each of the backside contacts is filled with a metal selected from the list consisting of: tungsten, cobalt, ruthenium.

* * * * *